(12) United States Patent
Seehawer

(10) Patent No.: US 6,373,044 B1
(45) Date of Patent: Apr. 16, 2002

(54) PHOTOELECTRIC SENSOR HAVING A HYSTERESIS CONTROL CIRCUIT

(75) Inventor: Scott Seehawer, Tampa, FL (US)

(73) Assignee: Tri-Tronics Company, Inc., Tampa, FL (US)

( * ) Notice: Subject to any disclaimer, the term of this patent is extended or adjusted under 35 U.S.C. 154(b) by 0 days.

(21) Appl. No.: 09/270,050

(22) Filed: Mar. 16, 1999

(51) Int. Cl.$^7$ ................................................. H01J 40/14
(52) U.S. Cl. ................................... 250/214 R; 250/205
(58) Field of Search ........................... 250/214 R, 205; 315/150, 156, 158; 372/29.021

(56) References Cited

U.S. PATENT DOCUMENTS

| | | | | |
|---|---|---|---|---|
| 4,521,681 A | * | 6/1985 | Inaba et al. | 250/205 |
| 5,089,748 A | * | 2/1992 | Ihms | 315/151 |
| 5,283,424 A | * | 2/1994 | Acquaviva et al. | 250/205 |
| 5,986,252 A | * | 11/1999 | Kawamura | 250/205 |
| 6,095,417 A | * | 8/2000 | Ahlquist et al. | 235/454 |

* cited by examiner

Primary Examiner—Que T. Le
Assistant Examiner—Thanh X. Luu
(74) Attorney, Agent, or Firm—McDermott, Will & Emery

(57) ABSTRACT

A photoelectric sensing circuit for adjusting the hysteresis of a photosensor. The photoelectric sensing circuit includes a photosensor capable of receiving light and generating an output signal indicating the amount of light incident on said photosensor. The photosensor generates a first output signal when the level of received light is above a first predetermined level, and a second output signal when the level of received light is below a second predetermined level. The circuit further includes a variable light source for generating and emitting the light incident on the photosensor and a power source coupled to the light source. The power source has a variable output level for controlling the intensity of the light emitted by the light source. Finally, the photoelectric sensing circuit also includes a control circuit coupled to the variable power source for varying the output level of the power source. In accordance with the operation of the photoelectric sensing circuit if the photosensor is outputting the first output signal, the control circuit reduces the output level of the power source so that the intensity of the emitted light results in a level of received light received by the photosensor which is below the first predetermined level, and if the photosensor is outputting the second output signal, the control circuit increases the output level of the power source so that the intensity of the emitted light results in a level of received light received by the photosensor which is above the second predetermined level.

17 Claims, 1 Drawing Sheet

PHOTOELECTRIC SENSOR HAVING A HYSTERESIS CONTROL CIRCUIT

FIELD OF THE INVENTION

The present invention relates to photoelectric sensing devices, and in particular to a photoelectric sensing device that provides for variable control of the hysteresis of a photoelectric sensor ("photosensor") contained within the device so as to allow for a reduction or increase in the hysteresis of the photoelectric sensor in accordance with the environment/application the photosensor is being utilized.

BACKGROUND OF THE INVENTION

Substantially, every photosensor (also known as a photo IC) is designed such that upon receiving a predetermined amount of light, the output of the photosensor is toggled to a given state (e.g., logic high) so as to indicate that the photosensor has received an amount of light exceeding the predetermined level. This first predetermined level is referred to as the "light state" trip point or the "dark-to-light" threshold. Then, as the amount of light received by the photosensor declines, there is a second predetermined level at which the output of the photosensor will toggle again so as to indicate that the amount of received light is below a second predetermined level. This second predetermined level is referred to as the "dark state" trip point or the "light-to-dark" threshold. The difference between the "light state" trip point and the "dark state" trip defines the hysteresis of the photosensor.

As is known, it is necessary for the photosensor to have hysteresis in order to prevent the photosensor's output from inadvertently switching or "chattering" due to, for example, electrical interference, minute changes in the level of light received by the photosensor, high frequency light, or pulsing EM fields, etc. However, it is also desirable to adjust the hysteresis of the photosensor in accordance with the application in which the photosensor is being utilized.

More specifically, in low contrast sensing environments, the photosensor needs to be able to resolve (i.e., detect) small changes in light. In order to accomplish this task, the hysteresis of the photosensor needs to be low. An example of a low contrast environment is a system for use with an automatic envelope stuffing machine, which is required to photoelectrically detect whether one or more papers of the same kind, have been placed in the same envelope by the machine. In this instance, the difference between the returned light level indicating the presence of the papers as compared to the absence of the papers is very small. As stated, in order to detect such a small change in the received light, the hysteresis of the photosensor needs to be low.

Alternatively, in high contrast sensing environments, it is preferably to have a photosensor with a large hysteresis so as to minimize the possibility of the photosensor's producing an erroneous output due to noise. High contrast environments include, for example, the detection of the presence or absence of paper in a copier or a facsimile machine.

Based on the foregoing, it is clear that it is advantageous to be able to control the hysteresis of the photosensor such that it can be adjusted in accordance with the environment/application in which it will be utilized. However, currently, the hysteresis of many commercially available photosensors is preset by the manufacturer and cannot be altered by the purchaser. As such, the hysteresis of the commercially available photosensors cannot be optimized for operation in accordance with the intended application.

Accordingly, there exists a need for a simple, cost effective photoelectric sensing circuit that provides for the control of the hysteresis of commercially available photosensors. Specifically, the photoelectric sensing circuit must provide for adjustment of the hysteresis so that the photosensor can be optimized for operation in accordance with its intended application (i.e., low contrast or high contrast). Moreover, the circuit must be simple and inexpensive such that the use of the photoelectric sensing circuit is commercially feasible.

SUMMARY OF THE INVENTION

Accordingly, the present invention relates to a photoelectric sensing circuit that provides for variable control of the hysteresis of commercially available photoelectric sensors.

More specifically, the present invention relates to a photoelectric sensing circuit comprising a photosensor capable of receiving light and generating an output signal indicating the amount of light incident on the photosensor. The photosensor generates a first output signal when the level of received light is above a first predetermined level, and a second output signal when the level of received light is below a second predetermined level. The circuit further comprises a variable light source for generating and emitting the light incident on the photosensor and a power source coupled to the light source. The power source has a variable output level for controlling the intensity of the light emitted by the light source. Finally, the photoelectric sensing circuit also comprises a control circuit coupled to the variable power source for varying the output level of the power source. In accordance with the operation of the photoelectric sensing circuit of the present invention, if the photosensor is outputting the first output signal, the control circuit reduces the output level of the power source so that the intensity of the emitted light results in a level of received light which is below the first predetermined level, and if the photosensor is outputting the second output signal, the control circuit increases the output level of the power source so that the intensity of the emitted light results in a level of received light which is above the second predetermined level. The foregoing operation of the control circuit effectively changes the hysteresis of the photosensor, which as stated is preset by the manufacturer.

As described in detail below, the present invention provides important advantages over prior art devices. Most importantly, the present invention provides a simple, cost effective circuit that allows for variable control of the hysteresis of the photosensor. As such, the photoelectric sensing circuit of the present invention allows a given photosensor to be optimized for use in either a low contrast sensing environment or a high contrast sensing environment.

In addition, as the novel photoelectric sensing circuit is simple and utilizes currently available photosensors, the circuit represents a cost effective, commercially feasible solution to the problems associated with prior art photosensors.

The invention itself, together with further objects and advantages, can be better understood by reference to the following detailed description and the accompanying drawings.

DETAILED DESCRIPTION OF THE INVENTION

Figure 1:
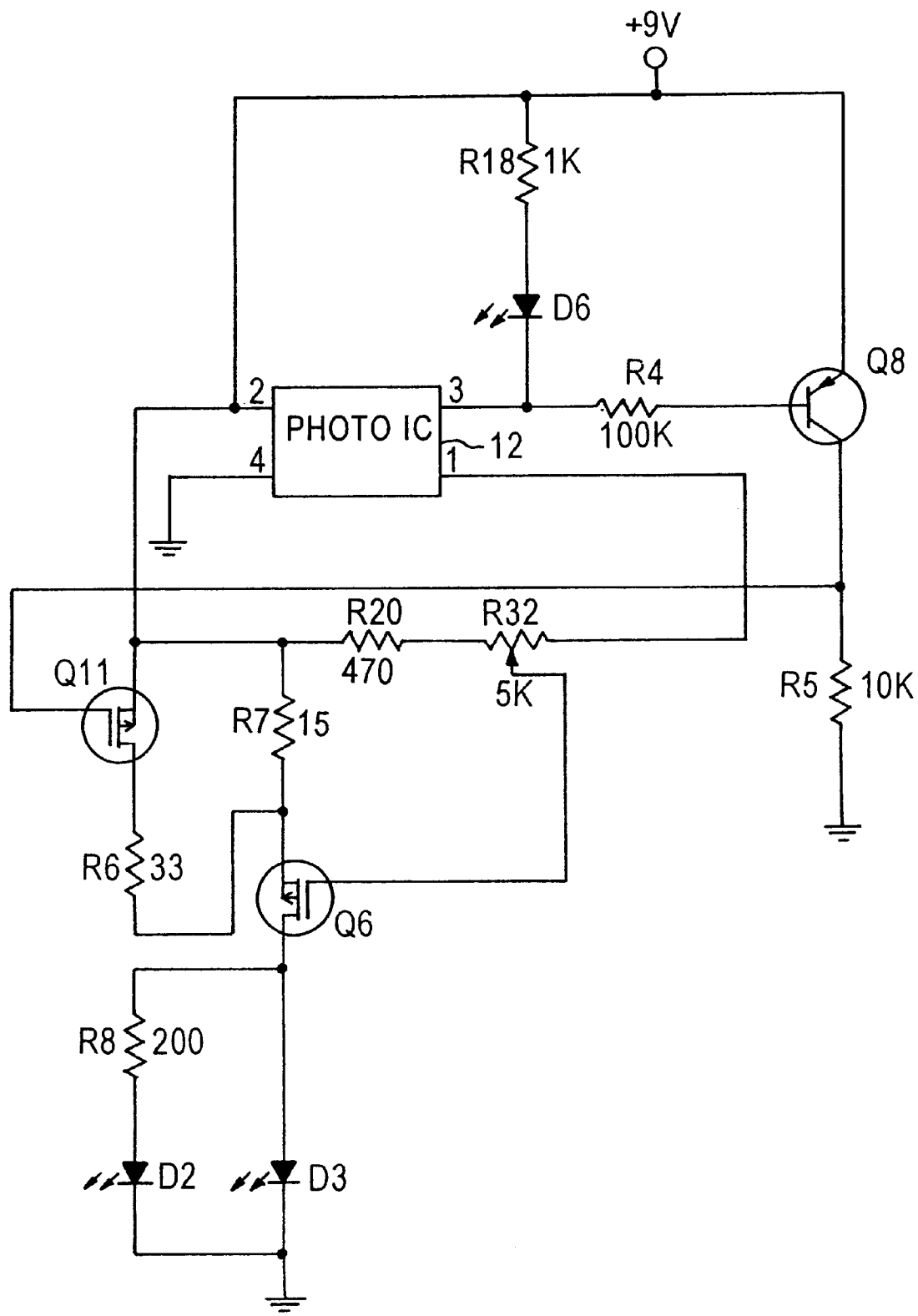
FIG. 1 illustrates an exemplary embodiment of the photoelectric sensing circuit of the present invention.

A photoelectric sensing circuit which provides for variable control of the hysteresis of a photosensor incorporated therein is described below. In the following description, numerous specific details are set forth, such as detailed circuit elements and exemplary values thereof, in order to provide a thorough and detailed understanding of the circuit of the present invention. It will be obvious, however, to one skilled in the art that these specific details need not be employed exactly as set forth herein to practice the present invention.

FIG. 1 illustrates a block diagram of an exemplary embodiment of the photoelectric sensing circuit of the present invention. As shown, the circuit includes a photosensor 12, which in the current embodiment is a photo IC from Hamamatsu (part no. S4282-51). The photosensor 12 is a four pin dual-in-line package, self contained sensor having a photodiode, amplifier, modulation, demodulator and an output driver for driving an external light source (i.e., emitter). With regard to the pin configuration, pin 2 receives 9V supply voltage, pin 4 is coupled to ground, pin 3 is the output of the photosensor 12, and pin 1 is the modulator output. An example of a modulating signal output by pin 1 is a 8 khz signal having a 5% duty cycle. The modulation of the external light source and demodulation of the received light substantially eliminates the effect of ambient light.

As stated above, photosensors such as the above-identified Hamamatsu, employ hysteresis to insure that the sensor will not be susceptible to noise during operation. For purposes of the following discussion, it will be assumed that the hysteresis employed by the photosensor 12 generates a dark-to-light trip point of 5V, and a light-to-dark trip point of 4V. In operation, once the level of light received by the photosensor 12 results in the internal demodulator (of the photosensor 12) producing a signal exceeding 5V, the dark-to-light threshold is passed, and the output of the photosensor 12 (pin 3) goes low. The output of the photosensor remains low until the amount of received light decreases sufficiently such that the internal demodulator produces a signal less than 4V. At this point, the light-to-dark threshold is passed, and the output of the photosensor 12 (pin 3) goes high. As stated above, the hysteresis of the photosensor 12 is set by the manufacturer and cannot be altered. The additional circuitry illustrated in FIG. 1 functions to effectively change the hysteresis of the photosensor 12 as detailed below. It is noted that for the purposes of simplicity the additional output circuitry utilized to couple the output of the photosensor 12 to other components has been omitted from FIG. 1.

Referring again to FIG. 1, a hysteresis control circuit includes the following components, transistors Q8 and Q11 and resistors R4, R5, R6 and R32, as well as a current source formed by transistor Q6 and resistor R7. As shown, the output of the photosensor 12 (pin 3) is coupled to the base of transistor Q8 via resistor R4. The emitter of transistor Q3 is coupled to a 9V source, and the collector is coupled to ground via resistor R5. The collector of transistor Q8 is also coupled to the gate of transistor Q11. Transistor Q11 is coupled in series to resistor R6, and the circuit formed by transistor Q11 and resistor R6 is coupled in parallel to resistor R7.

Continuing, the modulator output (pin 1) of the photosensor 12 is coupled via potentiometer R32 and resistor R20 to the current source formed by transistor Q6 and resistor R7. The gate of transistor Q6 is coupled to the variable arm of potentiometer R32 so as to allow for variation of the drive of transistor Q6, thereby allowing for an increase or decrease in the amount of current generated by the current source. The drain of transistor Q6 is coupled to a light emitting diode ("LED") D3, which functions as the light source of the circuit, and which is driven by the current generated by the current source formed by resistor R7 and transistor Q6. Accordingly, the intensity of the emitter D3 can be adjusted by varying the amount of current produced by the current source. It is noted that the sensitivity of the photosensor 12 is controlled by adjusting the intensity of the emitter D3. In the current embodiment, resistor R32 is a 15 turn, 5 kΩ potentiometer.

The operation of the foregoing circuit is as follows. As an initial state, it is assumed resistor R32 has been set in accordance with the desired sensitivity of the photosensor 12, and that the output of the photosensor 12 is currently high (i.e., in the dark state). In the initial state, the current source formed by transistor Q6 and resistor R7 generates a constant current, which drives emitter D3. When the light received by the photosensor 12 is sufficient to pass through the dark-to-light threshold, the output (pin 3) of the photosensor 12 becomes a logic low. This functions to turn transistor Q8 on, pull resistor R5 up to approximately 9V, and turn off transistor Q11. By turning off Q11, resistor R6 (which had been effectively connected in parallel with resistor R7) is removed from the current source. As such, the resistance of the current source increases and therefor the current produced by the current source decreases. Thus, the current in emitter D3 decreases, which reduces the emitter light intensity. As a result, the light intensity received by the photosensor 12 is reduced so that it is closer to the light-to-dark threshold.

This reduction of the emitter light intensity immediately after passing through the dark-to-light threshold functions to reduce the hysteresis of the photosensor 12. The values of the foregoing components are selected such that when resistor R6 is removed from the current source, the light intensity of the emitter D3 is reduced such that the light received by the photosensor 12 results in a signal level below the dark-to-light threshold and above the light-to-dark threshold. The amount of reduction in light intensity governs how much the hysteresis of the photosensor 12 will be reduced. As such, the desired amount of reduction in hysteresis is obtained by selecting the appropriate resistor values. From the foregoing it is clear that the closer the resulting signal level is to the light-to-dark threshold, the more the reduction in the hysteresis of the photosensor 12.

Continuing, when the light received by the photosensor 12 is reduced sufficiently such that it falls below the light-to-dark threshold, the output of the photosensor 12 (pin 3) becomes a logic high. This functions to turn transistor Q8 off, and pull the gate of transistor Q11 to ground through resistor R5, thereby turning on transistor Q11. By turning on Q11, resistor R6 is effectively connected in parallel with resistor R7. As such, the resistance of the current source decreases, which results in an increase in the current produced by the current source. Thus, the current in emitter D3 increases, which increases the emitter light intensity. As a result, the light intensity received by the photosensor 12 is increased so that it is closer to the dark-to-light threshold. It is noted that as transistor Q11 has little effect on the impedance of the circuit, resistor R6 is effectively connected in parallel to resistor R7 when transistor Q11 is turned on.

This increase of the emitter light intensity immediately after passing through the light-to-dark threshold functions to reduce the hysteresis of the photosensor 12. The values of the foregoing components are selected such that when resistor R6 is included in the current source circuit, the light intensity of the emitter D3 is increased such that the light received by the photosensor 12 results in a signal level below the dark-to-light threshold and above the light-to-dark threshold. The amount of increase in light intensity governs how much the hysteresis of the photosensor 12 will be reduced. As such, the desired amount of reduction in hysteresis is obtained by selecting the appropriate resistor values.

It is noted that because of the numerous possible variables, such as power supply amplitude, modulation signal amplitude, the preset hysteresis thresholds of the photosensor, the receiver operating characteristics of the photosensor, etc. no attempt is made to correlate changes in resistor values to changes in hysteresis thresholds. However, it is submitted that upon determination of the foregoing variables, the resistor values necessary to obtain the desired change in hysteresis can be readily calculated utilizing standard circuit analysis.

An example of the reduction in hysteresis is illustrative. As stated above, it is assumed that the hysteresis employed by the photosensor 12 generates a dark-to-light trip point of 5V, and a light-to-dark trip point of 4V. Thus, the hysteresis of the photosensor 12 requires a change in received light sufficient to result in a 1V change in the signal generated by the demodulator of the photosensor in order for the output of the photosensor 12 to change states. In accordance with the present invention, once the photosensor 12 transitions through the 5V dark-to-light threshold, the emitted light intensity is reduced such that the received light generates a 4.2V signal at the output of the demodulator. Accordingly, only a 0.2V reduction in received light is necessary to transition through the 4V light-to-dark threshold. Similarly, once the photosensor 12 transitions through the 4V light-to-dark threshold, the emitted light intensity is increased such that the received light generates a 4.8V signal at the output of the demodulator. Accordingly, only a 0.2V increase in received light is necessary to transition through the 5V dark-to-light threshold. As a result, utilizing the present invention, the hysteresis of the photosensor 12 only requires a change in received light sufficient to result in a 0.4V change in the signal generated by the demodulator of the photosensor in order for the output of the photosensor 12 to change states. Thus, the hysteresis of the photosensor 12 has been reduced from 1V to 0.2V. As is clear from the foregoing, the present invention allows the hysteresis to be set at any desired level. It is noted that utilizing the component values illustrated in FIG. 1 results in a 60–65% reduction in hysteresis.

Indeed, it is also possible to increase the hysteresis of a photosensor if required by the intended application. This can be accomplished by simply coupling an inverter (not shown) to the output (pin 3) of the photosensor 12 so as to invert the signal input to R4. (Referring to FIG. 1, it is preferable that the inverter be inserted to the right of the LED D6 such that LED D6 properly indicates the status of the output of the photosensor.) In accordance with this embodiment of the present invention, when the light received by the photosensor 12 is sufficient to pass through the dark-to-light threshold, the output (pin 3) of the photosensor 12 becomes a logic low and the output of the inverter (not shown) becomes high. This functions to turn transistor Q8 off, and pull the gate of transistor Q11 to ground through resistor R5, thereby turning on transistor Q11. Turning on Q11 connects resistor R6 in parallel with resistor R7. As such, the resistance of the current source decreases, which results in an increase in the current produced by the current source. Thus, the current in emitter D3 increases, which increases the emitter light intensity. As a result, the light intensity received by the photosensor 12 is increased so that it is farther away from the dark-to-light threshold, as well as being farther away from the light-to-dark threshold. This is equally applicable when transitioning from light-to-dark.

With regard to the additional circuitry illustrated in FIG. 1, a second LED D2 is coupled to the drain of transistor Q6 via resistor R8. LED D2 functions as an indicator. Specifically, the brightness level output by LED D2 varies in accordance with the light intensity output by LED D3. The circuit further includes a third LED D6, which functions to indicate the current state of the output of the photosensor 12.

Variations of the foregoing embodiments are also possible. For example, while the foregoing embodiment utilizes a Hamamatsu photosensor (photo IC), other photosensors (both commercial and non-commercial) can be incorporated into the circuit of the present invention. In addition, the present invention can be utilized with photosensors which include only a receiver, which receives pulse modulated light and produces an output signal indicating the amplitude (i.e., intensity) of the received pulse modulated light. Such receivers also utilize hysteresis to indicate the transition between multiple output states. The hysteresis circuitry can be incorporated within the receiver so as to be internal to the receiver, or alternatively, the hysteresis circuitry can be formed utilizing integrated circuit components, which are appropriately coupled to the receiver. An example of a "receiver only" circuit is a Sharp product, part no. IS1U60L.

As detailed above, the present invention provides important advantages over prior art devices. Most importantly, the present invention provides a simple, cost effective circuit that allows for variable control of the hysteresis of a photosensor. As such, the photoelectric sensing circuit of the present invention allows substantially any photosensor to be optimized for use in either a low contrast sensing environment or a high contrast sensing environment.

In addition, as the novel photoelectric sensing circuit is simple and utilizes currently available photosensors, the circuit represents a cost effective, commercially feasible solution to the problems associated with prior art photosensors.

Another advantage associated with the present invention is that the novel circuit can be utilized in an "optical proximity" sensing mode, a "retroflective" sensing mode, as well as a "fiberoptics" sensing mode as those terms are defined in U.S. Pat. No. 4,644,341.

The schematic diagram set forth in FIG. 1 is considered to be illustrative and not limiting, and the illustrated values for the various circuit components are merely suggestive of acceptable values. Other values may also be workable. Further, it should be understood that the illustrated components including diodes, transistors, and LEDs have numerous equivalent elements in the photosensor and electrical engineering arts, and are accordingly only representations of acceptable components.

In addition, the present invention may be embodied in other specific forms without departing from the spirit or essential characteristics thereof. The present embodiments are therefor to be considered in all respects as illustrative and not restrictive, the scope of the invention being indicated by the appended claims rather than the foregoing description, and all changes which come within the meaning and range of equivalency of the claims are therefor intended to be embraced therein.

We claim:

1. A photoelectric sensing circuit comprising: a photosensor capable of receiving light and generating an output signal indicating the amount of light incident on said photosensor, said photosensor generating a first output signal when a level of received light is above a first predetermined level, and a second output signal when a level of received light is below a second predetermined level, a light source for generating and emitting said light incident on said photosensor, said emitted light having a variable intensity, a power source coupled to said light source, said power source having a variable output level for controlling the intensity of said light emitted by said light source, and a control circuit coupled to said power source for varying the output level of said power source, wherein if said photosensor is outputting said first output signal, said control circuit reduces the output level of said power source so that the intensity of said emitted light results in a level of received light received by said photosensor which is below said first predetermined level, and if said photosensor is outputting said second output signal, said control circuit increases the output level of said power source so that the intensity of said emitted light results in a level of received light received by said photosensor which is above said second predetermined level, said photosensor having a preset hysteresis, said first predetermined level and said second predetermined level defining said hysteresis of said photosensor.

2. The photoelectric sensing circuit of claim 1, wherein said light source comprises a light emitting diode.

3. The photoelectric sensing circuit of claim 1, wherein said power source comprises a current source, said current source being coupled in series with said light source.

4. The photoelectric sensing circuit of claim 1, wherein said photosensor is a commercially available photosensor having a non-variable hysteresis, said photoelectric sensing circuit having an effective hysteresis which is less than the preset hysteresis of said photosensor.

5. The photoelectric sensing circuit of claim 3, wherein said control circuit comprises:

a first transistor coupled to said photosensor, said first transistor being turned on and off under control of the output signal of said photosensor, a second transistor coupled to an output of said first transistor, said second transistor being turned on and off under control of said first transistor, and a second resistor coupled in series with said second transistor.

6. The photoelectric sensing circuit of claim 5, wherein said control circuit operates to couple said second transistor and said second resistor in parallel, with a first resistor so as to increase the output level of said power supply.

7. The photoelectric sensing circuit of claim 5, wherein said control circuit operates to decouple said second transistor and said second resistor from a first resistor so as to decrease the output level of said power supply.

8. The photoelectric sensing circuit of claim 4, wherein said effective hysteresis of said photoelectric sensing circuit is variable in accordance with the values of components forming said control circuit and said power source.

9. A photoelectric sensing circuit comprising:

a photosensor capable of receiving light and generating an output signal indicating the amount of light incident on said photosensor, said photosensor generating a first output signal when a level of received light is above a first predetermined level, and a second output signal when a level of received light is below a second predetermined level, a light source for generating and emitting said light incident on said photosensor, said emitted light having a variable intensity, a power source coupled to said light source, said power source having a variable output level for controlling the intensity of said light emitted by said light source, and a control circuit coupled to said power source for varying the output level of said power source, wherein if said photosensor is outputting said first output signal, said control circuit increases the output level of said power source so that the intensity of said emitted light results in a level of received light received by said photosensor which is greater than said first predetermined level, and if said photosensor is outputting said second output signal, said control circuit decreases the output level of said power source so that the intensity of said emitted light results in a level of received light received by said photosensor which is below said second predetermined level.

said photosensor having a preset hysteresis, said first predetermined level and said second predetermined level defining said hysteresis of said photosensor.

10. The photoelectric sensing circuit of claim 9, wherein said light source comprises a light emitting diode.

11. The photoelectric sensing circuit of claim 9, wherein said power source comprises a current source, said current source being coupled in series with said light source.

12. The photoelectric sensing circuit of claim 9, wherein said photosensor is a commercially available photosensor having a non-variable hysteresis, said photoelectric sensing circuit having an effective hysteresis which is greater than the hysteresis of said photosensor.

13. The photoelectric sensing circuit of claim 12, wherein said control circuit comprises:

an inverter for receiving a output signal from said photosensor, a first transistor coupled to an output port of said inverter, said first transistor being turned on and off under control of the output signal of said inverter, a second transistor coupled to an output of said first transistor, said second transistor being turned on and off under control of said first transistor, and a second resistor coupled in series with said second transistor.

14. The photoelectric sensing circuit of claim 13, wherein said control circuit operates to couple said second transistor and said second resistor in parallel with a first resistor so as to increase the output level of said power supply.

15. The photoelectric sensing circuit of claim 13, where by said control circuit operates to decouple said second transistor said second resistor from a first resistor so as to decrease the output level of said power supply.

16. The photoelectric sensing circuit of claim 12, wherein said effective hysteresis of said photoelectric sensing circuit is variable in accordance with the values of components forming said control circuit and said power source.

17. A photoelectric sensing circuit comprising:

a receiver capable of receiving light and generating an output signal indicating the amount of light incident on said receiver, said receiver generating a first output signal when a level of received light is above a first predetermined level, and a second output signal when a level of received light is below a second predetermined level, a light source for generating and emitting said light incident on said receiver, said emitted light having a variable intensity, a power source coupled to said light source, said power source having a variable output level for controlling the intensity of said light emitted by said light source, and a control circuit coupled to said power source for varying the output level of said power source, wherein if said receiver is outputting said first output signal, said control circuit reduces the output level of said power source so that the intensity of said emitted light results in a level of received light received by said receiver which is below said first predetermined level, and if said receiver is outputting said second output signal, said control circuit increases the output level of said power source so that the intensity of said emitted light results in a level of received light received by said receiver which is above said second predetermined level, said receiver having a preset hysteresis, said first predetermined level and said second predetermined level defining said hysteresis of said receiver.

* * * * *